United States Patent
Poisson et al.

(10) Patent No.: US 11,417,486 B2
(45) Date of Patent: Aug. 16, 2022

(54) MULTIPURPOSE RELAY CONTROL

(71) Applicant: Hamilton Sundstrand Corporation, Charlotte, NC (US)

(72) Inventors: Richard A. Poisson, Avon, CT (US); Steven A. Avritch, Bristol, CT (US)

(73) Assignee: Hamilton Sundstrand Corporation, Charlotte, NC (US)

(*) Notice: Subject to any disclaimer, the term of this patent is extended or adjusted under 35 U.S.C. 154(b) by 424 days.

(21) Appl. No.: 16/601,112

(22) Filed: Oct. 14, 2019

(65) Prior Publication Data

US 2021/0110986 A1 Apr. 15, 2021

(51) Int. Cl.
| | | |
|---|---|---|
| *H01H 51/10* | (2006.01) | |
| *G01R 31/327* | (2006.01) | |
| *H01H 50/32* | (2006.01) | |
| *H01H 51/12* | (2006.01) | |
| *H01H 51/27* | (2006.01) | |
| *H03K 3/78* | (2006.01) | |
| *H03K 5/131* | (2014.01) | |

(52) U.S. Cl.
CPC .......... *H01H 51/10* (2013.01); *G01R 31/3278* (2013.01); *H01H 50/321* (2013.01); *H01H 51/12* (2013.01); *H01H 51/27* (2013.01); *H03K 3/78* (2013.01); *H03K 5/131* (2013.01); *H03K 2217/94052* (2013.01)

(58) Field of Classification Search
CPC ............ H02H 9/02; H02H 9/043; H02H 7/20; H02H 3/087; H02H 3/207; H02H 3/04; H02H 3/06; H02H 3/18; H02H 3/202; H02H 3/243; H02H 3/026; H02H 3/08; H02H 3/02; H02H 3/027; H02H 3/22
See application file for complete search history.

(56) References Cited

U.S. PATENT DOCUMENTS

| | | | |
|---|---|---|---|
| 4,097,832 A | 6/1978 | Ritzenthaler et al. | |
| 4,408,131 A | 10/1983 | Fox | |
| 5,406,439 A * | 4/1995 | Crane | H01H 47/002 |
| | | | 361/186 |
| 10,224,907 B2 | 3/2019 | Redpath | |

(Continued)

FOREIGN PATENT DOCUMENTS

EP   2591961 A1   5/2013

OTHER PUBLICATIONS

Extended European Search Report dated Jul. 22, 2020, received for corresponding European Application No. 19215805.3, 9 pages.

*Primary Examiner* — Bryan R Perez

(74) *Attorney, Agent, or Firm* — Kinney & Lange, P.A.

(57) ABSTRACT

A method of controlling the behavior of a latching relay includes receiving a configuration signal of either a first behavior signal or a second behavior signal, receiving a power status signal of either a powered or unpowered signal, receiving either a low-to-high or a high-to-low signal command signal, generating latching pulse in response to receiving a powered signal input as the power status signal and a low-to-high signal as the command signal, generating an unlatching pulse in response to receiving a powered signal input as the power status signal and a high-to-low signal as the command signal input, and generating an unlatching pulse in response to receiving the second behavior signal as the configuration signal and the unpowered signal as the power status signal.

8 Claims, 3 Drawing Sheets

(56) References Cited

U.S. PATENT DOCUMENTS

| | | | |
|---|---|---|---|
| 2015/0262745 A1* | 9/2015 | Parker | H01H 47/226 361/160 |
| 2019/0081503 A1 | 3/2019 | Kim | |
| 2019/0148976 A1 | 5/2019 | Okada et al. | |
| 2019/0229832 A1 | 7/2019 | Wang et al. | |

* cited by examiner

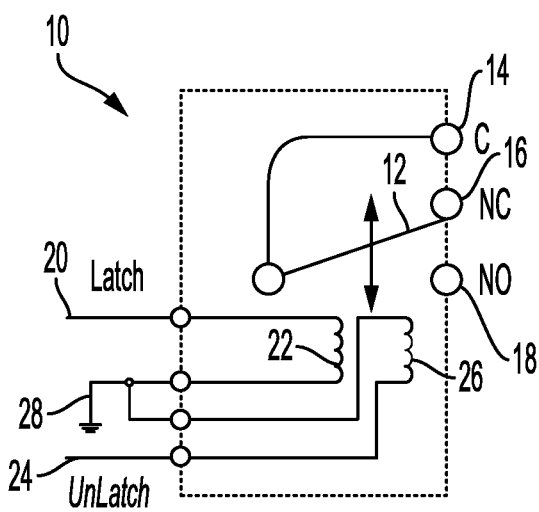
FIG. 1A
(PRIOR ART)
FIG. 1B
(PRIOR ART)
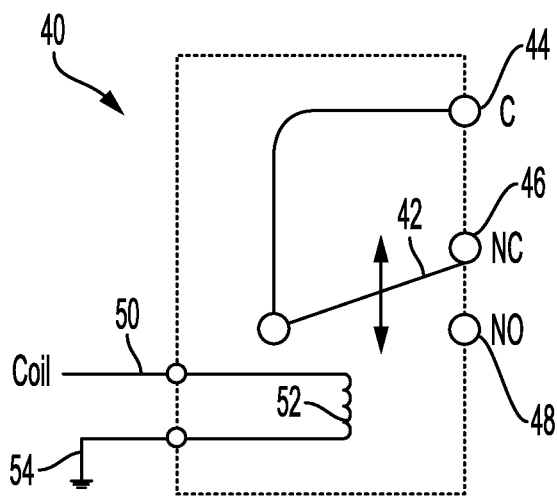
FIG. 2A
(PRIOR ART)
FIG. 2B
(PRIOR ART)

| Configurable Relay | | | | | | | |
|---|---|---|---|---|---|---|---|
| Command | Config | Power Status | Coil Driver out | | Contacts | | |
| | | | Latch | UnLatch | C | NC | NO |
| ⎍ | * | Powered | ⎍ | | o—o | | |
| ⎎ | * | Powered | | ⎍ | o— | | —o |
| * | Conventional | Loss of Power | | ⎍ | o— | | —o |
| * | Latching | Loss of Power | | | Retain last Commanded State | | |
| Without an input at either coil, or without a change in input, the contacts remain in the previously selected position regardless of system power | | | | | | | |

FIG. 4

MULTIPURPOSE RELAY CONTROL

BACKGROUND

The present disclosure relates generally to relays, and in particular, to a system for controlling the behavior of an electromagnetic relay.

Relays are known in the electrical art as being electromagnetic switches that can receive a control current to operate electrically-isolated electrical contacts to control a separate current path. Therefore, a relay can be used to provide a high degree of electrical isolation between a first circuit (i.e., control circuit) and a second circuit (i.e., load circuit). Moreover, a relay can be used to control a load current (i.e., second circuit) that is significantly larger than the control current (i.e., first circuit). Two known types of relays are conventional relays and latching relays, each having an operating characteristic that can be relevant to a particular application. Therefore, in a manufacturing setting, relays must be procured by specifying the quantities of conventional relays and latching relays that will be required for production of a particular application which uses both types of relays. This can be disadvantageous, particularly when the final circuit application of one or more relays (i.e., conventional or latching) is subject to design changes. Accordingly, there is a need for a system that can control the behavior of an electrical relay having a single design, thereby allowing a particular relay to be programmed to behave as either a conventional relay or as a latching relay.

SUMMARY

A method of controlling a behavior of a relay configured to receive a latch command for entering into a latch condition and an unlatch command for entering into an unlatch condition includes receiving, by a logic controller, a configuration signal comprising either a first behavior signal or a second behavior signal, receiving, by the logic controller, a power status signal comprising either a powered signal or an unpowered signal, receiving, by the logic controller, a command signal comprising either a low-to-high signal or a high-to-low signal, generating, by a first pulse generator communicatively coupled to the logic controller, a latching pulse in response to receiving a powered signal input as the power status signal and a low-to-high signal as the command signal input, generating, by a second pulse generator communicatively coupled to the logic controller, an unlatching pulse in response to receiving a powered signal input as the power status signal and a high-to-low signal as the command signal input, and generating, by the second pulse generator communicatively coupled to the logic controller, the unlatching pulse in response to receiving the second behavior signal as the configuration signal and the unpowered signal as the power status signal.

A system for controlling a behavior of a relay configured to receive a latch command for entering into a latch condition and an unlatch command for entering into an unlatch condition includes a logic controller, configured to receive a configuration signal input comprising either a first behavior signal or a second behavior signal, a power status signal input comprising either a powered signal or an unpowered signal, and a command signal input comprising either a low-to-high signal or a high-to-low signal, a first pulse generator configured to generate a latching pulse in response to receiving a powered signal input as the power status signal and a low-to-high signal as the command signal input, and a second pulse generator configured to generate an unlatching pulse in response to receiving a powered signal input as the power status signal and a high-to-low signal as the command signal input or receiving the second behavior signal as the configuration signal and the unpowered signal as the power status signal.

A relay configured for use in electrical circuits that are configured to employ at least one conventional relay and/or are configured to employ at least one latching relay, the relay having a first operating mode in which the relay behaves as the conventional relay, and a second operating mode in which the relay behaves as a latching relay.

BRIEF DESCRIPTION OF THE DRAWINGS

FIG. 1A is an electrical schematic diagram of a latching relay of the prior art.

FIG. 1B is a logic state diagram for the latching relay shown in FIG. 1A.

FIG. 2A is an electrical schematic diagram of a conventional relay of the prior art.

FIG. 2B is a logic state diagram for the conventional relay shown in FIG. 2A.

FIG. 4 is a logic state diagram for a latching relay connected to the relay behavior-changing controller shown in FIG. 4.

DETAILED DESCRIPTION

Figure 3:
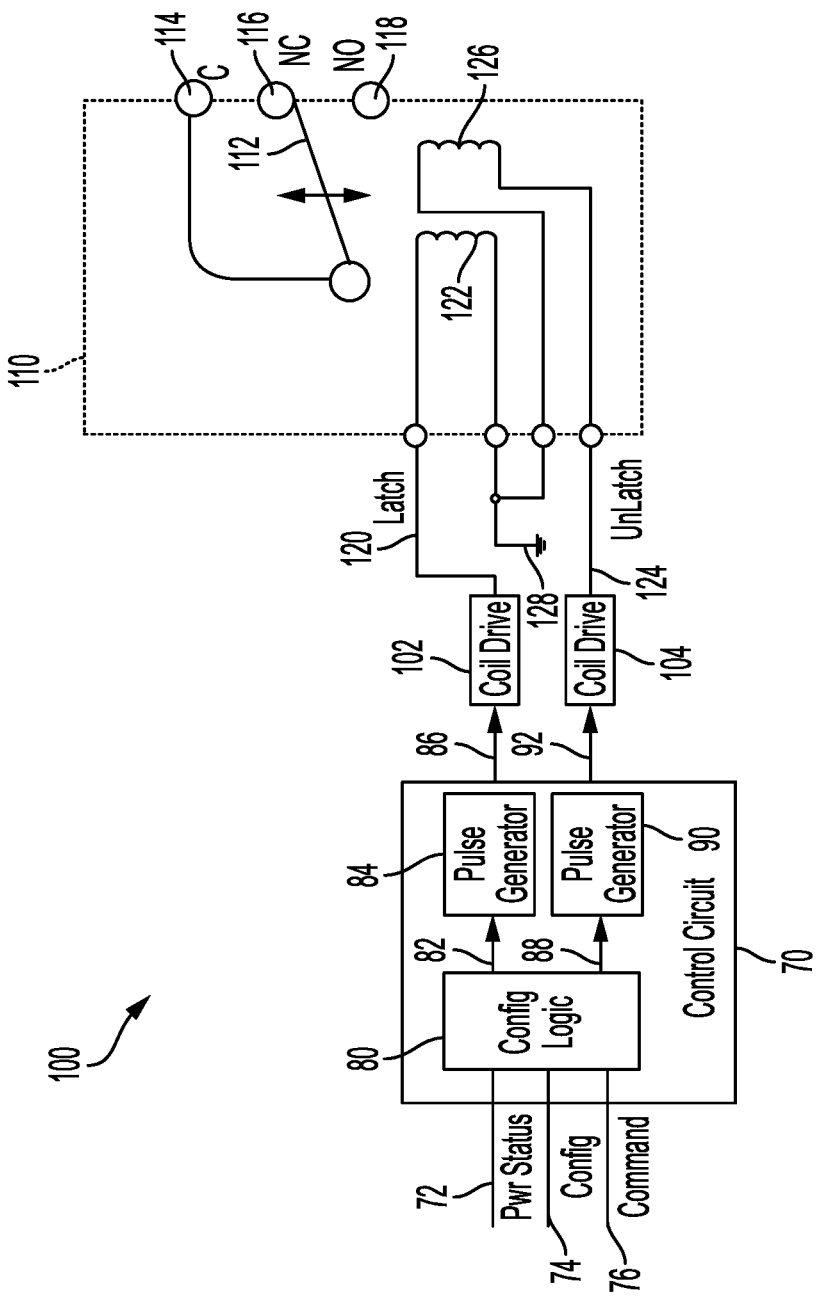
FIG. 3 is a schematic block diagram of a relay behavior-changing controller.

FIG. 1A is an electrical schematic diagram of a latching relay of the prior art. Shown in FIGS. 1A-1B are latching relay 10, contactor 12, common contact 14, normally closed contact 16, normally open contact 18, latching control terminal 20, latching coil 22, unlatching control terminal 24, unlatching coil 26, common control terminal 28, and logic state diagram 30. Latching relay 10 includes contactor 12 which makes electrical contact between common contact 14 and either normally closed (NC) contact 16 or normally open (NO) contact 18, depending on the condition of latching relay 10, as will be described. When a latching current pulse is applied to latching control terminal 20, latching coil 22 is energized thereby drawing contactor 12 toward NC contact 16, creating an electrical connection between common contact 14 and NC contact 16. Accordingly, latching relay 10 is said to be in the latched condition. In the latched condition, there is not an electrical connection between common contact 14 and NO contact 18. Latching relay 10 is depicted in the latched condition in FIG. 1A. Latching relay 10 transitions to the latched condition during the application of the latching current pulse. Latching relay 10 remains in the latched condition after the latching current pulse subsides (i.e., returns to zero). When an unlatching current pulse is applied to unlatching control terminal 24, unlatching coil 26 is energized thereby drawing contactor 12 toward NO contact 18, creating an electrical connection between common contact 14 and NO contact 18. Accordingly, latching relay 10 is said to be in the unlatched condition. In the unlatched condition, there is not an electrical connection between common contact 14 and NC contact 16. In the illustrated embodiment, common control terminal 28 is a ground connection, providing a common signal path for both latching control terminal 20 and unlatching control terminal 24.

FIG. 1B is a logic state diagram for latching relay 10 shown in FIG. 1A. The behavior of latching relay 10, as was described above in regard to FIG. 1A, is depicted in logic state diagram 30. Latching relay 10 can be used when a control system (not shown in FIG. 1A) generates control pulses that are used to change the condition of latching relay 10. Latching relay 10 can be referred to as a bi-stable switch (i.e., having two stable conditions). An advantage of using latching relay 10 is that under steady-state conditions (i.e., when not receiving a latching current pulse or an unlatching current pulse), neither latching coil 22 nor unlatching coil 26 are energized. In some applications, for example, where a power budget is critical, it can be advantageous that latching coil 22 and unlatching coil 26 remain de-energized during steady-state conditions.

FIG. 2A is an electrical schematic diagram of a conventional relay of the prior art. Shown in FIG. 2A are conventional relay 40, contactor 42, common contact 44, normally closed contact 46, normally open contact 48, control terminal 50, control coil 52, and common control terminal 54. Conventional relay 40 includes contactor 42 which makes electrical contact between common contact 44 and normally closed (NC) contact 46 or normally open (NO) contact 48, depending on the condition of control coil 52, as will be described. When a control current (i.e., energizing current) is applied to control terminal 50, control coil 52 is energized thereby drawing contactor 42 toward NO contact 48, creating an electrical connection between common contact 44 and NO contact 48. Accordingly, conventional relay 40 is said to be in the energized condition. In the energized condition, there is not an electrical connection between common contact 44 and NC contact 46. Conventional relay 40 remains in the energized condition so long as the control current is applied to control terminal 50. When control terminal 50 is de-energized (i.e., the control current is removed), conventional relay 40 returns to the de-energized condition. In the de-energized condition, an electrical connection is made between common contact 44 and NC contact 46, and the electrical connection between common contact 44 and NO contact 48 is broken. In a typical embodiment, a mechanical spring (not shown in FIG. 2A) is compressed by contactor 42 when contactor 42 is drawn to NO contact 48 by control coil 52. Therefore, when control coil 52 is de-energized, the mechanical spring forces contactor 42 to return to NC contact 46. Conventional relay 40 is depicted in the de-energized condition in FIG. 2A. The de-energized condition can be referred to as the "normal" condition in conventional relay 40, thereby explaining the conventions used in labeling normally closed and normally open contacts (e.g., NC contact 46, NO contact 48). Conventional relay 40 can also be referred to as a normal relay. Common control terminal 54 is so named because it provides a common (i.e., ground) connection for control coil 52.

FIG. 2B is a logic state diagram for conventional relay 40 shown in FIG. 2A. The behavior of conventional relay 40 as was described above in regard to FIG. 2A is depicted in logic state diagram 60. Conventional relay 40 can be used when a control system (not shown in FIG. 2A) generates an output current that represents the current that is intended to be supplied to a load. Conventional relay 40 can be referred to as a mono-stable switch (i.e., having one stable condition). An advantage of using conventional relay 40 is the design simplicity, whereby a control current condition (i.e., on or off) can be used to control a load condition (i.e., on or off). In some applications, for example, where it is desirable that a load remain energized only when a control current is present, it can be advantageous that conventional relay 40 return to the normal (i.e., de-energized) condition when the control current is lost.

FIG. 3 is a schematic block diagram of a relay behavior-changing controller. FIG. 4 is a logic state diagram for a latching relay connected to the relay behavior-changing controller shown in FIG. 3. Shown in FIGS. 3-4 are controller 70, power status input 72, configuration status input 74, command input 76, configuration logic 80, latching control signal 82, latching pulse generator 84, latching pulse signal 86, unlatching control signal 88, unlatching pulse generator 90, unlatching pulse signal 92, relay system 100, latching coil driver 102, unlatching coil driver 104, configurable relay 110, contactor 112, common contact 114, normally closed contact 116, normally open contact 118, latching control terminal 120, latching coil 122, unlatching control terminal 124, unlatching coil 126, common control terminal 128, and logic state diagram 130. Reference will be made to logic state diagram 130 in FIG. 4 while describing relay system 100 in FIG. 3. Controller 70 can be referred to as a control circuit or as a relay behavior-changing controller. Configuration logic 80 within controller 70 receives three input signals: power status input 72, configuration status input 74, and command input 76. A description will first be made of the operation of other aspects of control circuit 70 within relay system 100. Configuration logic 80 (i.e., "config logic") is configured to produce latching control signal 82 and unlatching control signal 88 when it is desired to latch or unlatch configurable relay 110, respectively. Latching control signal 82, when generated, is input to latching pulse generator 84 which in turn provides latching pulse signal 86 to latching coil driver 102, thereby delivering a latching current pulse to latching control terminal 120 of configurable relay 110. In an similar manner, unlatching control signal 88, when generated, is input to unlatching pulse generator 90 which in turn provides unlatching pulse signal 92 to unlatching coil driver 104, thereby delivering an unlatching current pulse to unlatching control terminal 124 of configurable relay 110. Latching and unlatching pulse generators 84, 90 can be referred to as monostable multivibrators or as "one-shots", because they generate an output pulse of a defined duration when triggered, then return to their resting condition. In the illustrated embodiment, configurable relay 110 is a latching relay at the component level. A latching relay can also be referred to as a bi-stable relay, as a "keep" relay, and as a "stay" relay, because it keeps (i.e., stays) in a particular condition after being activated by a signal (e.g., latch or unlatch signal).

Configurable relay 110 includes contactor 112 which makes an electrical contact via contactor 112 between common contact 114 and either normally closed (NC) contact 116 or normally open (NO) contact 118, depending on the condition of configurable relay 110. When a latching current pulse is applied to latching control terminal 120, latching coil 122 is energized thereby drawing contactor 112 toward NC contact 116, creating an electrical connection between common contact 114 and NC contact 116. Accordingly, configurable relay 110 can be said to be latched, or in a latched condition. The latched condition can also be referred to as a first condition. When configurable relay 110 is latched, there is not an electrical connection between common contact 114 and NO contact 118. Configurable relay 110 is depicted in the latched (i.e., first) condition in FIG. 3. When an unlatching current pulse is applied to unlatching control terminal 124, unlatching coil 126 is energized thereby drawing contactor 112 toward NO contact 118, creating an electrical connection between common contact 114 and NO contact 118. Accordingly, relay 10 is said to be in the unlatched condition. The unlatched condition can also be referred to as a second condition. When configurable relay 110 is in the unlatched condition, there is not an electrical connection between common contact 114 and NC contact 116. In the illustrated embodiment, common control terminal 128 is a ground connection, providing a common signal path for both latching control terminal 120 and unlatching control terminal 124.

As noted earlier, configurable relay 110 includes common contact 114 which makes an electrical connection via contactor 112 with either NC contact 116 or NO contact 118. Configurable relay 110 can be described as having a single switching pole, and as being a single-pole double-throw (SPDT) switch. In some embodiments, more than a single switching pole (i.e., pole) of contacts can be used. For example, two switching poles (i.e., two contactors 112) can be connected by a common actuator (not shown in FIG. 3), resulting in a double-pole double-throw (DPDT) switch. Typically, each switching pole will have a separate contactor 112 that is electrically isolated from the others. A two-pole relay (i.e., DPDT) can be used to control two load circuits (not shown in FIG. 3). In an exemplary DPDT embodiment, a first pole can control a load current, and a second pole can control a feedback circuit that provides an indication of the condition of configurable relay 110 to a different circuit (not shown in FIG. 3). In other embodiments, three or more poles can be used in configurable relay 110. In these other embodiments, configurable relay 110 can be referred to as an NPDT switch where N represents the number of switching poles, which can include any number of switching poles. The present disclosure includes any number of switching poles in configurable relay 110. In any of these embodiments, either NC contact 116 or NO contact 118 can be omitted from one or more switching poles of configurable relay 110. In an exemplary embodiment, configurable relay 110 can include a single switching pole having common contact 114 and a single other contact (i.e., either NC contact 116 or NO contact 118). In this exemplary embodiment, configurable relay 110 can be referred to as a single-pole single-throw (SPST) switch.

Referring again to FIGS. 3-4, configuration logic 80 can receive power status input 72, configuration status input 74, and command input 76, as noted earlier. Power status input is either "powered" or "unpowered" (i.e., loss of power). Configuration status input 74 is either "conventional" (i.e., normal) or "latching", depending on the relay type that configurable relay 110 is configured to behave as. Providing a "conventional" input at configuration status input 74 can be referred to as a first operating condition of configurable relay 110, and providing a "latching" input at configuration status input 74 can be referred to as a second operating condition of configurable relay 110. Command input 76 is either a "low-to-high" or a "high-to-low" signal transition, as desired to change the condition of configurable relay 110. The behavior of configurable relay 110 can be made to function as a latching relay by providing a "latching" input at configuration status input 74. Under the "latching" input condition, an unpowered (i.e., loss of power) input at power status input 72 has no effect, and configuration logic 80 does not produce any signal output. Accordingly, the position of contactor 112 in configurable relay 110 does not change when power status input is unpowered (i.e., loss of power), and the configuration of common contact 114, NC contact 116, and NO contact 118 remains the same as shown in logic state diagram 130. When control circuit 70 is configured for configurable relay 110 to emulate the function of a conventional relay (i.e., configuration status input 74 is "conventional"), a powered input signal at power status input 72 will cause configuration logic 80 to generate an output signal at latching control signal 82, thereby directing a latching current pulse to latching coil 122. When the powered input signal is removed at power status input 72 (i.e., loss of power), configuration logic 80 will generate an output signal at unlatching control signal 88, thereby directing an unlatching current pulse to unlatching coil 126, as described above.

Providing a "latching" input at configuration status input 74 will configure control circuit 70 to emulate the function of a latching relay (i.e., the second operating condition of configurable relay 110). Accordingly, a "low-to-high" signal at command input 76 will cause configuration logic 80 to produce latching control signal 82, thereby directing a latching current pulse to latching coil 122, causing configurable relay 110 to transition to a latched condition as described above. Similarly, a "high-to-low" signal at command input 76 will cause configuration logic 80 to produce unlatching control signal 88, thereby directing an unlatching current pulse to unlatching coil 126, causing configurable relay 110 to transition to an unlatched condition as described above. In the illustrated embodiment, with a powered input to power status input 72 indicating the system is powered, the input signal applied to configuration status input 74 has no bearing and the control of configurable relay 110 is driven by the input at command input 76. Accordingly, logic state diagram 130 provides an asterisk in the Config column (i.e., configuration status input 74) denoting that configuration status input 74 is irrelevant. Controller 70 of the present embodiment is particularly adapted for a latch-unlatch signal residing on a single input line (i.e., command input 76). In other embodiments, controller 70 can be adapted to receive discrete "latch" and "unlatch" signals. Being a latching relay, configurable relay 110 requires two commands to function (i.e., latch and unlatch). In contrast, a conventional relay requires only one input (i.e., a voltage applied to a control terminal). The reason a latching relay requires an input command (i.e., a latch or unlatch command) is the internal bi-stable design of the latching relay that requires and allows for the latching relay to remain in an existing state (i.e., latched or unlatched) when power is removed. Accordingly, controller 70 allows configurable relay 110 (i.e., a latching relay) to emulate the behavior of a conventional relay when configuration status input 74 is "normal" (i.e., conventional). In other words, controller 70 allows a latching relay to be used as a conventional relay, if so desired. The only condition under which configuration status input 74 matters is during the time surrounding a loss of power. At the moment when controller 70 detects power is being lost, configuration logic 80 uses configuration status input 74 to determine in what state to leave configurable relay 110 when power is eventually lost (i.e., latched or unlatched). If configuration status input 74 is "latching", then configuration logic 82 leaves configurable relay 110 in its current state (i.e., latched or unlatched). If configuration status input 74 is "conventional", then, at the point of power loss, configuration logic 80 commands will command configurable relay 110 to the NO condition (i.e., unlatched), thereby emulating a conventional relay. The behavior of configurable relay 110 can be controlled at any time during the operation of relay system 100 by changing the input to configuration status input 74 (i.e., from "conventional" to "latching", or from "latching" to "conventional"). Accordingly, configurable relay 110 can be said to be reconfigurable "on the fly" during the operation of relay system 100, thereby providing operational flexibility.

A particular advantage of controller 70 shown in FIGS. 3-4 is to provide the designer the flexibility to develop and manufacture a single component design for configurable relay 110 which can then be configured to behave as (i.e., emulate) either a conventional or a latching relay. In some situations, significant time and effort can be avoided that would otherwise need to be used in developing and manufacturing two relay component designs (i.e., conventional and latching relays). It can be appreciated that in some situations, critical component specifications can require long and involved procurement lifecycles. Non-limiting examples of critical component specifications include materials selection, packaging design, quality criteria, reliability and testing requirements, and vendor qualification. In specifying a single component design for configurable relay 110, significant design flexibility can be provided to the design of various circuit assemblies that will call for conventional and/or latching relays by incorporating a single component design for configurable relay 110. Accordingly, when a top level assembly is being developed for manufacturing and volume ramp-up, controller 70 can be helpful in maximizing the design flexibility involving relay components.

DISCUSSION OF POSSIBLE EMBODIMENTS

The following are non-exclusive descriptions of possible embodiments of the present invention.

A method of controlling a behavior of a relay configured to receive a latch command for entering into a latch condition and an unlatch command for entering into an unlatch condition, the method comprising: receiving, by a logic controller, a configuration signal comprising either a first behavior signal or a second behavior signal; receiving, by the logic controller, a power status signal comprising either a powered signal or an unpowered signal; receiving, by the logic controller, a command signal comprising either a low-to-high signal or a high-to-low signal; generating, by a first pulse generator communicatively coupled to the logic controller, a latching pulse in response to receiving a powered signal input as the power status signal and a low-to-high signal as the command signal input; generating, by a second pulse generator communicatively coupled to the logic controller, an unlatching pulse in response to receiving a powered signal input as the power status signal and a high-to-low signal as the command signal input; and generating, by the second pulse generator communicatively coupled to the logic controller, the unlatching pulse in response to receiving the second behavior signal as the configuration signal and the unpowered signal as the power status signal.

The method of the preceding paragraph can optionally include, additionally and/or alternatively, any one or more of the following features, configurations and/or additional components:

A further embodiment of the foregoing method, further comprising: generating, by a first coil driver configured to receive the latching pulse from the first pulse generator, a latching current pulse in response to receiving the latching pulse; and generating, by a second coil driver configured to receive the unlatching pulse from the second pulse generator, an unlatching current pulse in response to receiving the unlatching pulse.

A further embodiment of the foregoing method, further comprising: applying, to a latching coil on the relay, the latching current pulse, thereby directing the relay into a latched condition; and applying, to an unlatching coil on the relay, the unlatching current pulse, thereby directing the relay into an unlatched condition.

A system for controlling a behavior of a relay configured to receive a latch command for entering into a latch condition and an unlatch command for entering into an unlatch condition, the system comprising: a logic controller, configured to receive: a configuration signal input comprising either a first behavior signal or a second behavior signal; a power status signal input comprising either a powered signal or an unpowered signal; and a command signal input comprising either a low-to-high signal or a high-to-low signal; a first pulse generator, configured to generate a latching pulse in response to receiving a powered signal input as the power status signal and a low-to-high signal as the command signal input; and a second pulse generator, configured to generate an unlatching pulse in response to: receiving a powered signal input as the power status signal and a high-to-low signal as the command signal input; or receiving the second behavior signal as the configuration signal and the unpowered signal as the power status signal.

The system of the preceding paragraph can optionally include, additionally and/or alternatively, any one or more of the following features, configurations and/or additional components:

A further embodiment of the foregoing system, further comprising: a first coil driver, configured to: receive the latching pulse from the first pulse generator; and generate a latching current pulse in response to receiving the latching pulse; and a second coil driver, configured to: receive the unlatching pulse from the second pulse generator; and generate an unlatching current pulse in response to receiving the unlatching pulse.

A relay configured for use in electrical circuits that are configured to employ at least one conventional relay and/or are configured to employ at least one latching relay, the relay having a first operating mode in which the relay behaves as the conventional relay, and a second operating mode in which the relay behaves as a latching relay.

The relay of the preceding paragraph can optionally include, additionally and/or alternatively, any one or more of the following features, configurations and/or additional components:

A further embodiment of the foregoing relay, wherein the relay is configured to be used in an electrical circuit regardless of whether the electrical circuit is configured to employ a conventional relay that requires electrical power to maintain a first position instead of a second position or a latching relay configured to remain in a previous position regardless of whether electrical power is actively being applied.

A further embodiment of the foregoing relay, further comprising: a latching coil, configured to receive a latch command for entering the relay into a latched condition; and an unlatching coil, configured to receive an unlatch command for entering the relay into an unlatched condition; wherein: the relay is configured to receive the latch command from a first pulse generator configured to generate a latching pulse in response to receiving a powered signal input as a power status signal and a low-to-high signal as a command signal input; and the relay is configured to receive the unlatch command from a second pulse generator configured to generate an unlatching pulse in response to: receiving a powered signal input as the power status signal and a high-to-low signal as the command signal input; or receiving a second behavior signal as a configuration signal and an unpowered signal as the power status signal.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of controlling a behavior of a latching relay so that it operates as a latching relay in response to receiving a configuration signal indicating a latching mode of operation and it emulates operation as a non-latching relay in response to the configuration signal indicating a non-latching mode of operation, the method comprising:
   receiving, by a logic controller, the configuration signal indicating the latching mode of operation or indicating the non-latching mode of operation;
   receiving, by the logic controller, a power status signal indicative of either a powered state or an unpowered state signal;
   receiving, by the logic controller, a relay command signal comprising either a low-to-high transition and/or a high-to-low transition;
   generating, by a first pulse generator communicatively coupled to the logic controller, a latching pulse in response to the power status signal indicating the powered state and a low-to-high transition of the relay command signal;
   generating, by a second pulse generator communicatively coupled to the logic controller, an unlatching pulse in response the power status signal indicating the powered state and a high-to-low transition of the relay command signal; and
   generating, by the second pulse generator communicatively coupled to the logic controller, the unlatching pulse in response to both the configuration signal indicating the non-latching mode of operation and the power status signal indicating the unpowered state,
   wherein the unlatching pulse is not generated by the second pulse generator when both the configuration signal indicates the latching mode of operation and the power status signal indicates the unpowered state.

2. The method of claim 1, further comprising:
   generating, by a first coil driver configured to receive the latching pulse from the first pulse generator, a latching current pulse in response to receiving the latching pulse; and
   generating, by a second coil driver configured to receive the unlatching pulse from the second pulse generator, an unlatching current pulse in response to receiving the unlatching pulse.

3. The method of claim 2, further comprising:
   applying, to a latching winding on the relay, the latching current pulse, thereby directing the relay into a latched condition; and
   applying, to an unlatching coil on the relay, the unlatching current pulse, thereby directing the relay into an unlatched condition.

4. A system for controlling a latching relay so that it operates as a latching relay in response to receiving a configuration signal indicating a latching mode of operation and it emulates operation as a non-latching relay in response to the configuration signal indicating a non-latching mode of operation, the system comprising:
   a logic controller, configured to receive:
      the configuration signal indicating either the latching mode of operation or the non-latching mode of operation;
      a power status signal indicative of either a powered state or an unpowered state; and
      a relay command signal input comprising either a low-to-high transition and/or a high-to-low transition;
   a first pulse generator that generates a latching pulse in response to the power status signal indicating a powered state and a low-to-high transition of the relay command signal; and
   a second pulse generator, configured to generate an unlatching pulse in response to:
      the power status signal indicating the powered state and a high-to-low transition of the relay command signal; or
      the configuration signal indicating the non-latching mode of operation and the unpowered signal as the power status signal indicating an unpowered state,
      wherein the unlatching pulse is not generated by when both the configuration signal indicates the latching mode of operation and the power status signal indicates the unpowered state.

5. The system of claim 4, further comprising:
   a first coil driver, configured to:
      receive the latching pulse from the first pulse generator; and
      generate a latching current pulse in response to receiving the latching pulse; and
   a second coil driver, configured to:
      receive the unlatching pulse from the second pulse generator; and
      generate an unlatching current pulse in response to receiving the unlatching pulse.

6. A dual-mode latching relay controller that controls a latching relay so that it operates as a latching relay in response to receiving a configuration signal indicating a latching mode of operation and it emulates operation as a non-latching relay in response to the configuration signal indicating a non-latching mode of operation;
   wherein the dual-mode latching relay controller provides an unlatching pulse to the latching relay in response to both the configuration signal indicating the non-latching mode of operation and a power status signal indicating an unpowered state, and
   wherein the unlatching pulse is not provided by the dual-mode latching relay to the latching relay when both the configuration signal indicates the latching mode of operation and the power status signal indicates the unpowered state.

7. The dual-mode latching relay controller of claim 6, wherein the latching relay is configured to be used in an electrical circuit regardless of whether the electrical circuit is configured to employ a conventional relay that requires electrical power to maintain a first position instead of a second position or a latching relay configured to remain in a previous position regardless of whether electrical power is actively being applied.

8. The dual-mode latching relay controller of claim 6, wherein the latching relay further comprises:
   a latching coil, configured to receive a latch command for entering the relay into a latched condition; and
   an unlatching coil, configured to receive an unlatch command for entering the relay into an unlatched condition;
   wherein:
      the relay is configured to receive the latch command from a first pulse generator configured to generate a latching pulse in response to receiving a powered signal input as a power status signal and a low-to-high signal as a command signal input; and the relay is configured to receive the unlatch command from a second pulse generator configured to generate an unlatching pulse in response to:

receiving a powered signal input as the power status signal and a high-to-low signal as the command signal input; or receiving the configuration signal indicating the non-latching mode of operation and an unpowered signal as the power status signal.

* * * * *